US007929311B1

(12) United States Patent
Tseng et al.

(10) Patent No.: US 7,929,311 B1
(45) Date of Patent: Apr. 19, 2011

(54) PORTABLE ELECTRONIC DEVICE

(75) Inventors: Yen-Jung Tseng, Tu-Cheng (TW); Cho-Kang Hsu, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 0 days.

(21) Appl. No.: 12/814,558

(22) Filed: Jun. 14, 2010

(30) Foreign Application Priority Data

Sep. 30, 2009 (CN) .......................... 2009 1 0308055

(51) Int. Cl.
*H05K 1/14* (2006.01)

(52) U.S. Cl. ........ 361/737; 361/732; 361/769; 361/785; 439/64; 439/153; 439/159; 439/267; 439/329; 439/374; 439/626; 439/630; 343/702; 343/841; 343/860; 343/873

(58) Field of Classification Search .................. 361/737, 361/732, 769, 785; 439/64, 153, 159, 267, 439/329, 374, 626, 630; 343/702, 841, 860, 343/873
See application file for complete search history.

(56) References Cited

U.S. PATENT DOCUMENTS

| | | | | |
|---|---|---|---|---|
| 4,887,188 | A * | 12/1989 | Yoshida et al. | 361/679.31 |
| 4,920,353 | A * | 4/1990 | Mori et al. | 343/702 |
| 4,958,165 | A * | 9/1990 | Axford et al. | 343/770 |
| 5,223,801 | A * | 6/1993 | Bergman | 331/76 |
| 5,401,176 | A * | 3/1995 | Lwee | 439/64 |
| 5,519,577 | A * | 5/1996 | Dudas et al. | 361/737 |
| 6,295,031 | B1 * | 9/2001 | Wallace et al. | 343/702 |
| 6,297,774 | B1 * | 10/2001 | Chung | 343/700 R |
| 7,208,916 | B1 * | 4/2007 | Boatwright et al. | 320/150 |
| 7,255,603 | B2 * | 8/2007 | Kato et al. | 439/630 |
| 7,261,240 | B2 * | 8/2007 | Akiho et al. | 235/492 |
| 7,367,503 | B2 * | 5/2008 | Harai et al. | 235/441 |
| 7,391,378 | B2 * | 6/2008 | Mikkola et al. | 343/702 |
| 2001/0029588 | A1 * | 10/2001 | Nakamura et al. | 713/300 |
| 2003/0216082 | A1 * | 11/2003 | Sato et al. | 439/630 |
| 2004/0135733 | A1 * | 7/2004 | Chou et al. | 343/841 |
| 2005/0037659 | A1 * | 2/2005 | Wu | 439/374 |
| 2005/0054320 | A1 * | 3/2005 | Noro et al. | 455/344 |
| 2005/0059299 | A1 * | 3/2005 | Zhu et al. | 439/607 |
| 2005/0225950 | A1 * | 10/2005 | Matsuda et al. | 361/737 |
| 2005/0247786 | A1 * | 11/2005 | Chen | 235/441 |
| 2005/0272283 | A1 * | 12/2005 | Chang | 439/92 |
| 2006/0040560 | A1 * | 2/2006 | Uchida et al. | 439/630 |
| 2006/0139214 | A1 * | 6/2006 | Deng et al. | 343/700 MS |
| 2006/0172573 | A1 * | 8/2006 | Laitinen et al. | 439/159 |
| 2006/0281500 | A1 * | 12/2006 | Huang et al. | 455/575.1 |
| 2008/0007464 | A1 * | 1/2008 | Hsu | 343/702 |
| 2008/0018541 | A1 * | 1/2008 | Pang et al. | 343/702 |
| 2008/0062048 | A1 * | 3/2008 | Hsu et al. | 343/702 |
| 2008/0143610 | A1 * | 6/2008 | Wang et al. | 343/702 |
| 2008/0194288 | A1 * | 8/2008 | Castaneda et al. | 455/553.1 |
| 2008/0252536 | A1 * | 10/2008 | Anguera et al. | 343/702 |
| 2008/0305665 | A1 * | 12/2008 | Hong et al. | 439/153 |
| 2008/0305669 | A1 * | 12/2008 | Hong et al. | 439/329 |
| 2008/0305685 | A1 * | 12/2008 | Hong et al. | 439/626 |
| 2009/0002242 | A1 * | 1/2009 | Lasarov et al. | 343/702 |

(Continued)

*Primary Examiner* — Ishwarbhai B Patel
*Assistant Examiner* — Xiaoliang Chen
(74) *Attorney, Agent, or Firm* — Steven M. Reiss

(57) ABSTRACT

A portable electronic device includes a housing, a circuit board received in the housing, and a memory card retaining mechanism received in the housing. The memory card retaining mechanism includes a plurality of conductive parts. The plurality of conductive parts cooperatively form an antenna integrated with the memory card retaining mechanism and connected to the circuit board.

6 Claims, 7 Drawing Sheets

U.S. PATENT DOCUMENTS

| | | | | |
|---|---|---|---|---|
| 2009/0034217 | A1* | 2/2009 | Hamner et al. | 361/769 |
| 2009/0298316 | A1* | 12/2009 | Maruyama | 439/267 |
| 2010/0039347 | A1* | 2/2010 | Chen et al. | 343/873 |
| 2010/0207826 | A1* | 8/2010 | Ryou et al. | 343/702 |
| 2010/0216520 | A1* | 8/2010 | Lee | 455/572 |
| 2010/0217910 | A1* | 8/2010 | Bryant-Rich | 710/301 |

* cited by examiner

PORTABLE ELECTRONIC DEVICE

BACKGROUND

1. Technical Field

The present disclosure relates to portable electronic devices, and particularly to a portable electronic device with a built-in antenna.

2. Description of Related Art

Portable electronic devices, such as mobile phones, personal digital assistants (PDA) and laptop computers, generally have antennas mounted therein for receiving/sending wireless signals. To obtain high quality communication signals, the antennas must be of sufficient size. Thus, the portable electronic devices need to have a sufficient amount of space allocated therein to accommodate the size of the antennas. However, larger antennas increase cost, and adversely affect the desired miniaturization of the portable electronic devices in order to accommodate them.

Therefore, there is room for improvement within the art.

BRIEF DESCRIPTION OF THE DRAWINGS

Many aspects of the present portable electronic device can be better understood with reference to the following drawings. The components in the various drawings are not necessarily drawn to scale, the emphasis instead being placed upon clearly illustrating the principles of the present portable electronic device. Moreover, in the drawings, like reference numerals designate corresponding parts throughout the figures.

DETAILED DESCRIPTION

Figure 1:
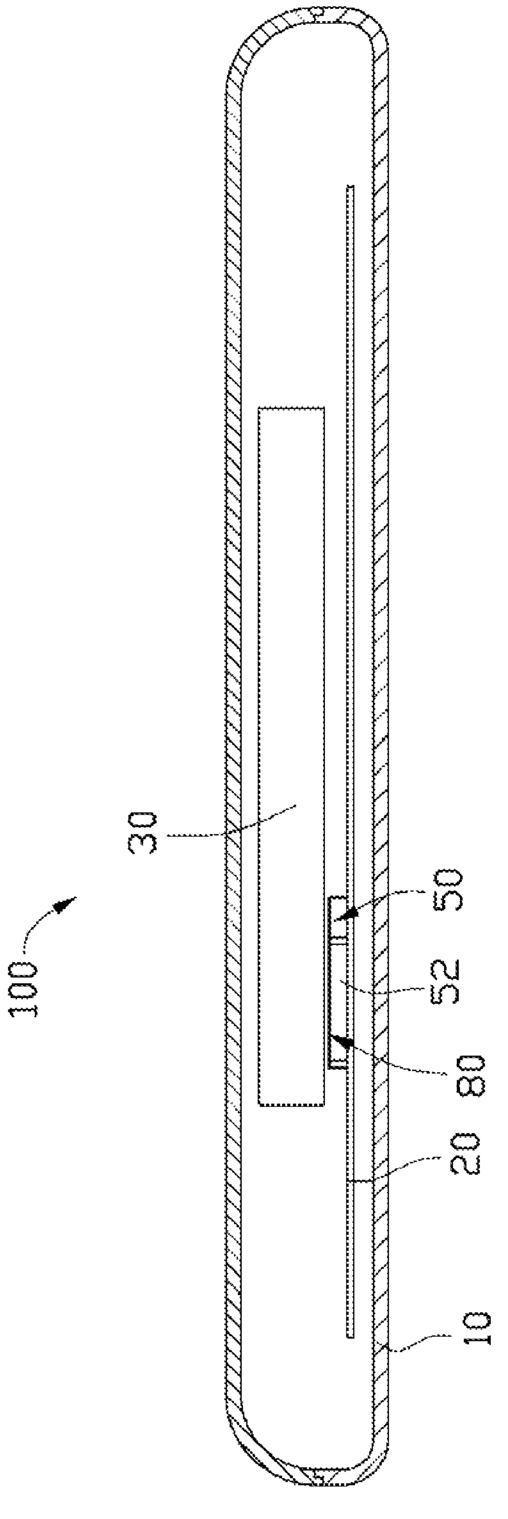
FIG. 1 is a cut-away view of a portable electronic device, according to an exemplary embodiment.

FIG. 1 schematically shows a portable electronic device 100, according to an exemplary embodiment. The portable electronic device 100 can be a mobile phone, a personal digital assistant (PDA), etc. The portable electronic device 100 includes a housing 10, a circuit board 20, a battery 30, a secure digital memory card (SD card) retaining mechanism 50. The circuit board 20, the battery 30, and the SD card retaining mechanism 50 are all received in the housing 10. While reference is made to an SD card, any type of memory card and associated retaining mechanism may be used.

Figure 2:
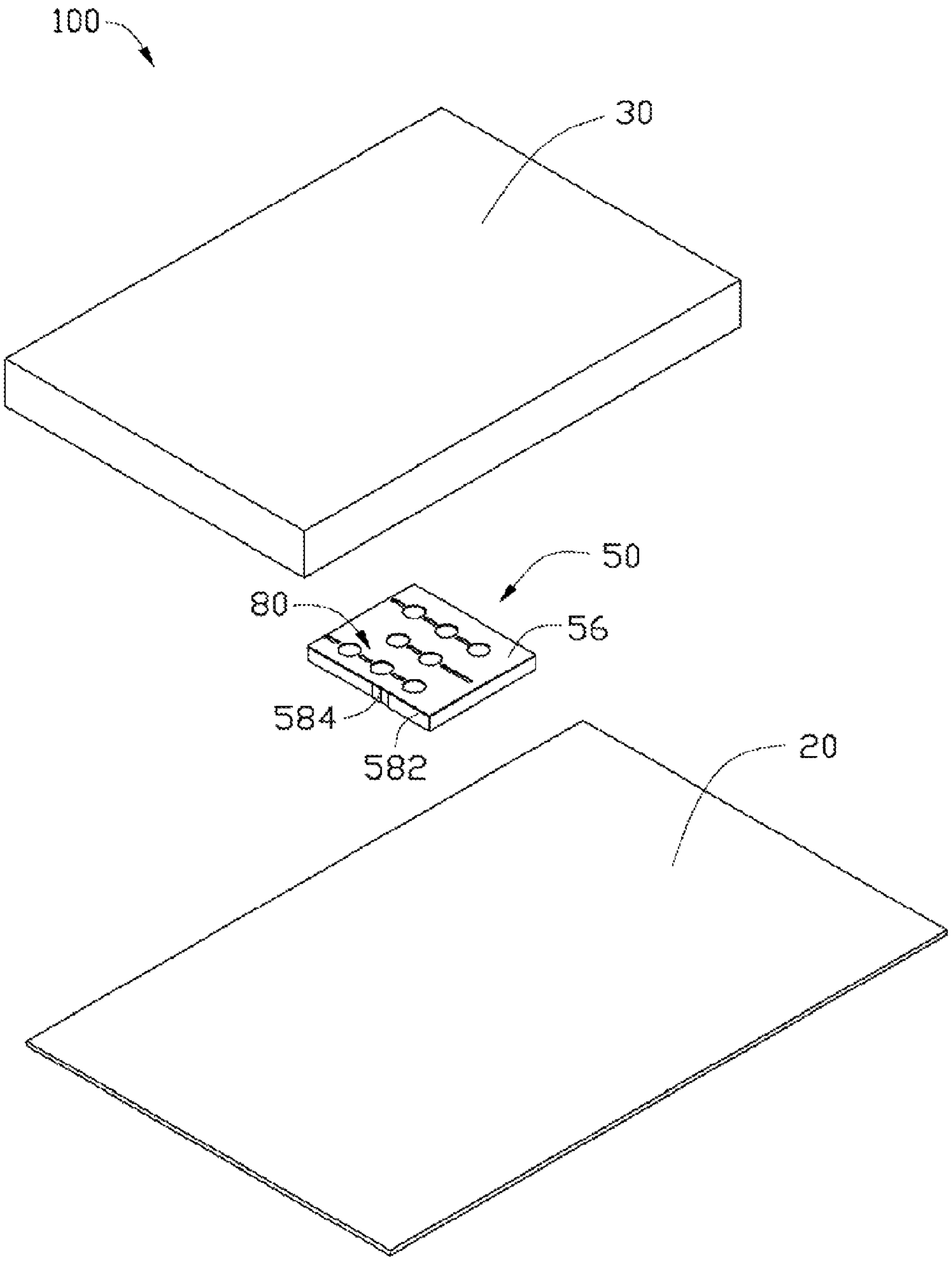
FIG. 2 is a schematic view of a battery, a secure digital memory card (SD card) retaining mechanism, and a circuit board of the portable electronic device shown in FIG. 1.

The circuit board 20 is part of the inner circuitry of the portable electronic device 100. Also referring to FIG. 2, the battery 30 is above the circuit board 20, and can be electrically connected to the circuit board 20 by conventional means, such as connectors or wires (not shown). The SD card retaining mechanism 50 is connected to the circuit board 20 and is between the battery 30 and the circuit board 20.

Figure 3:
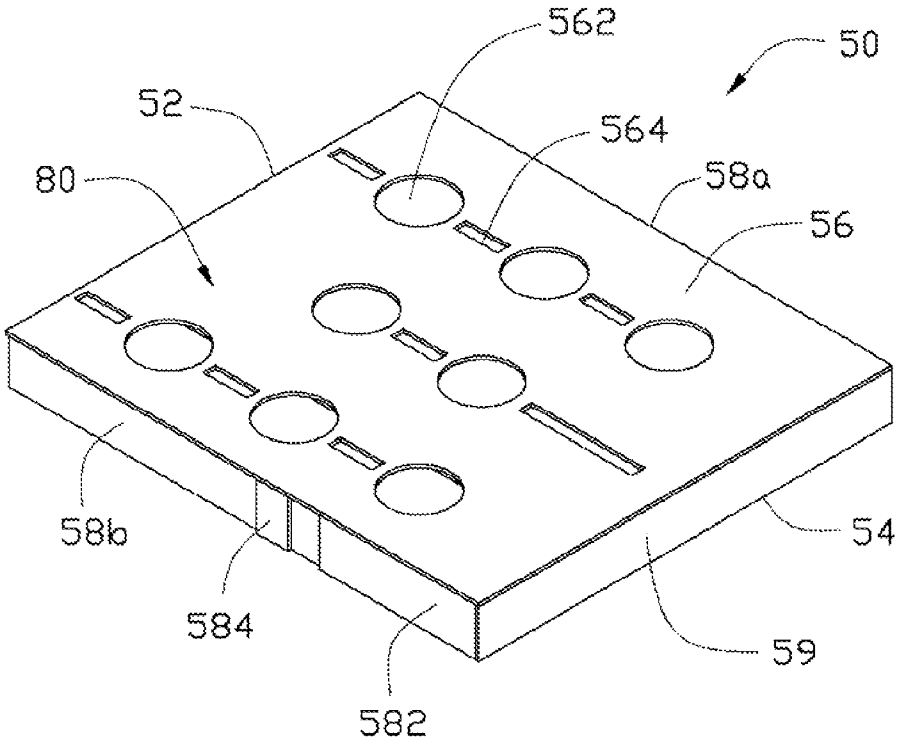
FIG. 3 is an enlarged view of the SD card retaining mechanism shown in FIG. 2.

Also referring to FIG. 3, the SD card retaining mechanism 50 is a substantially rectangular case. A conventional circuit (not shown) configured for connecting an SD card (not shown) received in the SD card retaining mechanism 50 to the circuit board 20 can be installed in the SD card retaining mechanism 50. The SD card retaining mechanism 50 includes a bottom board 54, a top board 56, a first sidewall 58*a*, a second sidewall 58*b*, and an end wall 59. The bottom board 54 and the top board 56 are parallel to each other. The top board 56 defines a plurality of round holes 562 and longitudinal slots 564 therein. The first sidewall 58*a*, the second sidewall 58*b*, and the end wall 59 are between the bottom board 54 and the top board 56, and are respectively perpendicularly connected to the bottom board 54 and the top board 56. The first sidewall 58*a* and the second sidewall 58*b* are parallel to each other and both perpendicularly extend from a same side of the end wall 59. Thus, the bottom board 54, the top board 56, the first sidewall 58*a*, the second sidewall 58*b*, and the end wall 59 cooperatively form a receiving space (not shown) to receive SD cards, and an opened entrance end 52 is formed between the ends of the first sidewall 58*a* and the second sidewall 58*b* that are away from the end wall 59. SD cards (not shown) can be inserted into the receiving space through the entrance end 52.

In the SD card retaining mechanism 50, the top board 56, the first sidewall 58*a*, and the end wall 59 are all made of conductive material or materials, and the second sidewall 58*b* is made of insulating material or materials. The SD card retaining mechanism 50 further includes a first connector member 582 and a second connector member 584. The first connector member 582 and the second connector member 584 are both planar sheets made of conductive material or materials. The first connector member 582 and the second connector member 584 are both mounted on the second sidewall 58*b*, and are separated from each other. A side of the first connector member 582 is connected to the top board 56, and an end of the first connector member 582 is connected to the end wall 59. A side of the second connector member 584 is connected to the top board 56.

In assembly, the bottom board 54 is attached to the circuit board 20. The first connector member 582 and the second connector member 584 are also connected to the circuit board 20. The circuit board 20 is then connected to the housing 10. A ground (not shown) of the portable electronic device 100 is connected to the first connector member 582 through the circuit board 20. A conventional antenna feed signal generator (not shown) of the portable electronic device 100 is connected to the second connector member 584 through the circuit board 20. The battery 30 is inserted into the housing 10 and is above the SD card retaining mechanism 50.

Besides receiving SD cards and electrically connecting SD cards to the circuit board, the SD card retaining mechanism 50 can function as an antenna. Particularly, the conductive parts of the SD card retaining mechanism 50, i.e., the top board 56, the first sidewall 58*a*, the first connector member 582, the second connector member 584, and the end wall 59, cooperatively form an antenna 80 integrated with the SD card retaining mechanism 50. The top board 56, first sidewall 58*a*, and end wall 59 are used to send and receive radiating signals, particularly BLUETOOTH signals. The antenna 80 is grounded through the first connector member 582. Feed signals are provided to the antenna 80 through the second connector member 584.

When the antenna 80 is used, each hole 562 can cooperate with the top board 56 to form an aperture antenna unit, and each slot 564 can cooperate with the top board 56 to form a slot antenna unit. Changing the number of, sizes, shapes or arrangements of the holes 562 and the slots 564 located on the top board 56 can regulate the impedance of the antenna 80, and further regulate the communication characteristic of the antenna 80. For example, regulating the length of any slot 564 can regulate the wavelengths and frequencies of wireless signals sent/received by the slot antenna unit corresponding to the slot 564, and increasing the diameter of any hole 562 can increase the plus of the aperture antenna unit corresponding to the hole 562.

Regulating the distance between the battery 30 and the top board 56 can allow conductive parts (not shown) of the battery 30 (e.g., the cell of the battery 30) to be coupled with the antenna 80 to improve overall performance of the antenna 80. Thus, the conductive parts of the battery 30 can radiate in unison with the antenna 80 and serve as another radiating portion of the antenna 80, substantially increasing the size of the radiating portion of the antenna 80. In this way, the communication quality of the antenna 80 can be improved.

Figure 4:
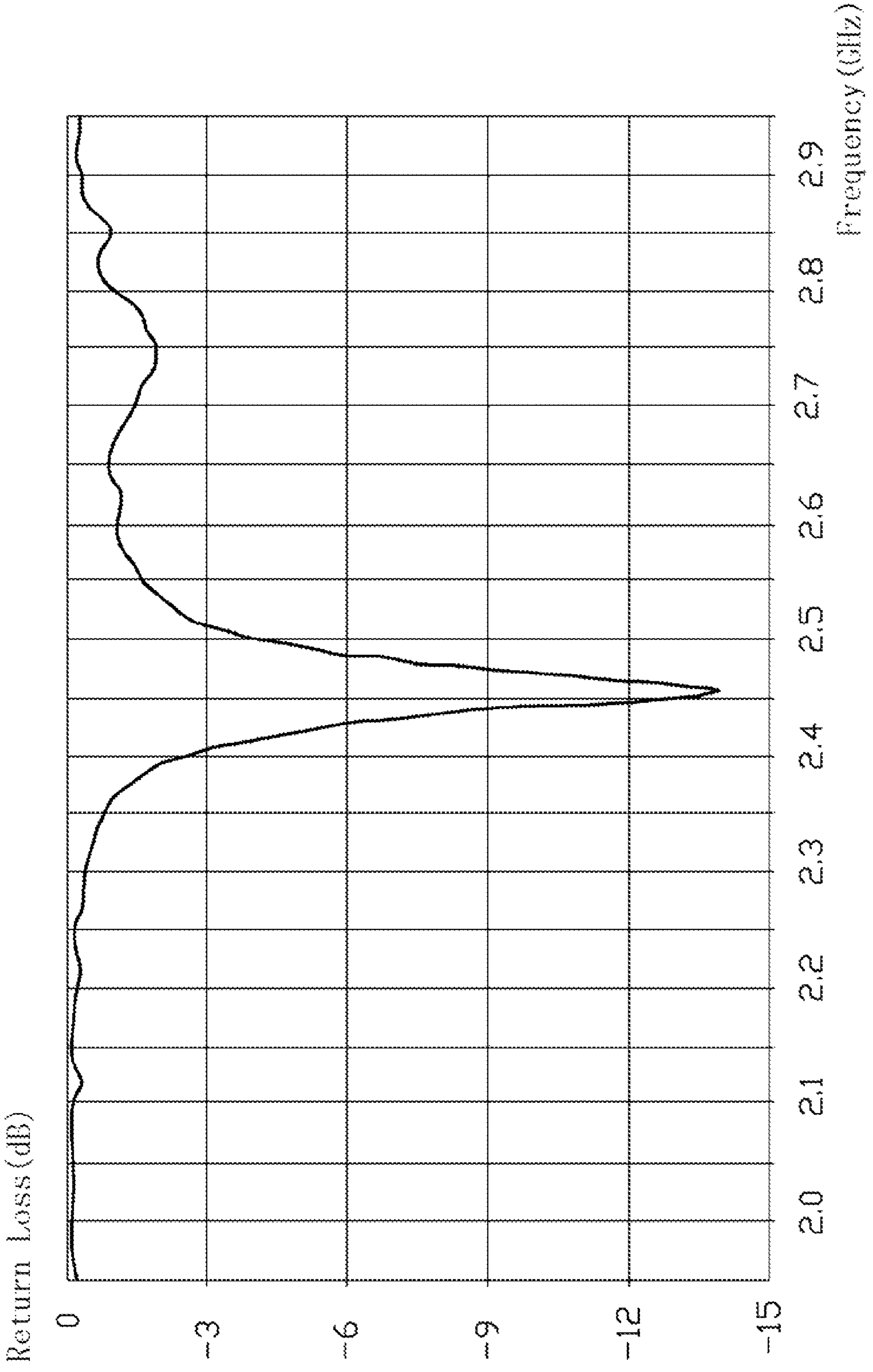
FIG. 4 is a diagram of a return loss of the portable electronic device shown in FIG. 1.
Figure 5:
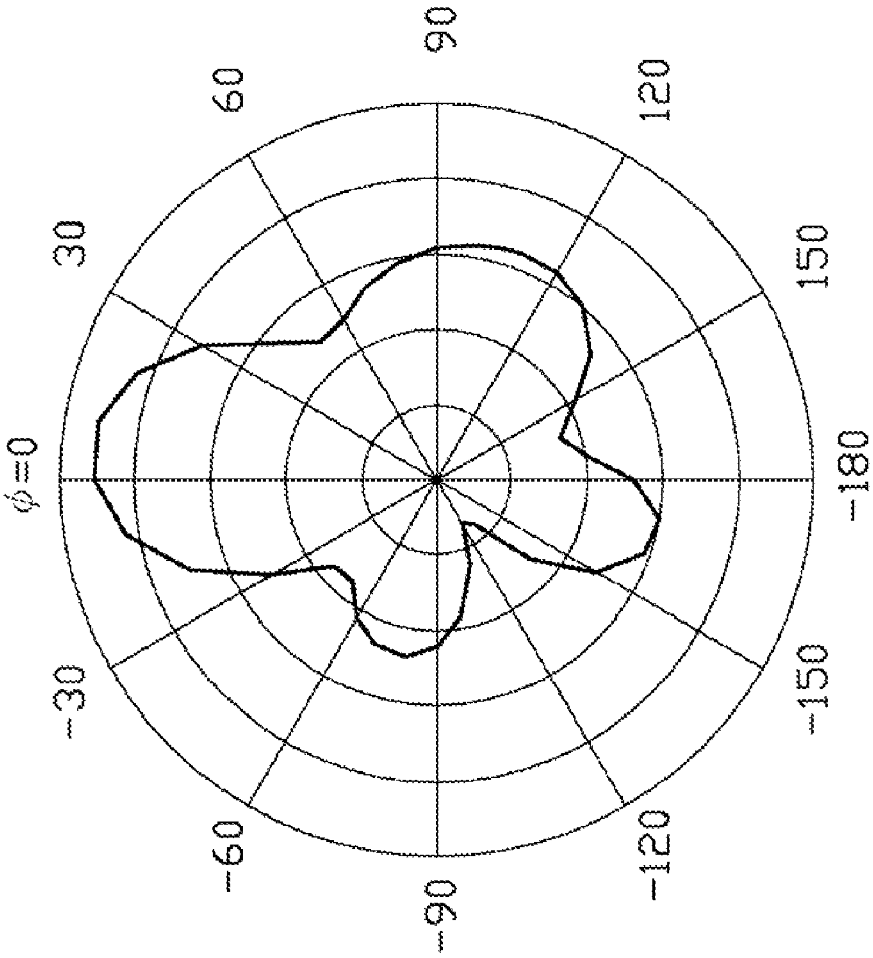
FIG. 5 is a diagram of an X-Z plane radiation field of the portable electronic device shown in FIG. 1.
Figure 6:
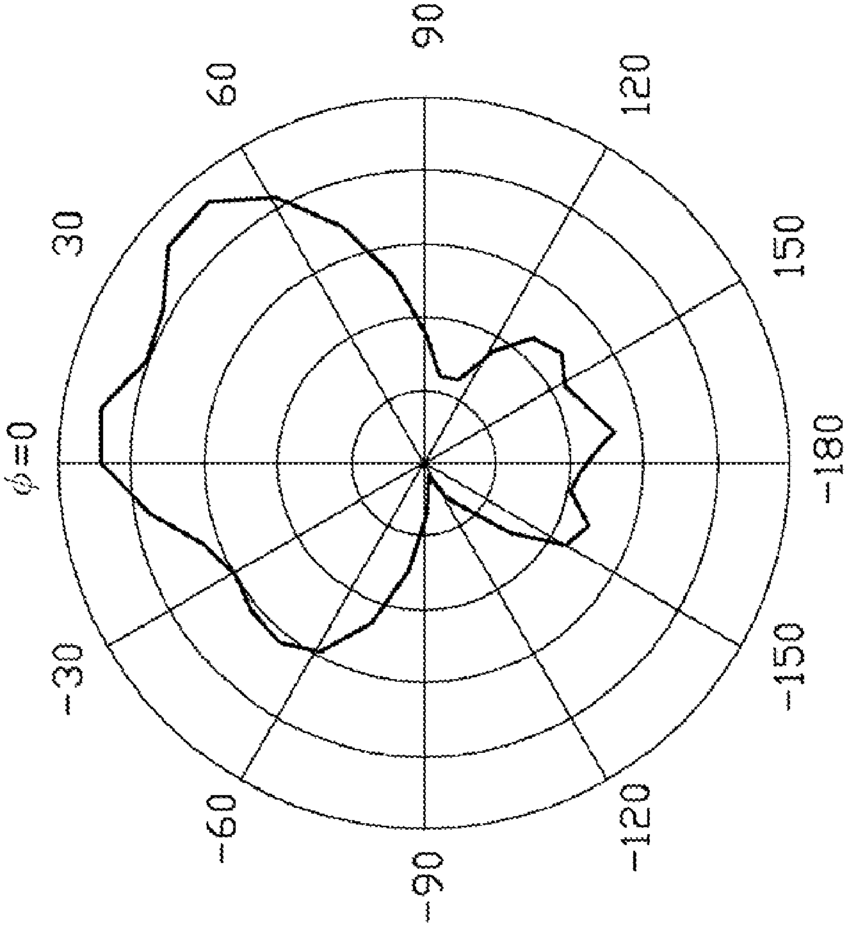
FIG. 6 is a diagram of a Y-Z plane radiation field of the portable electronic device shown in FIG. 1.
Figure 7:
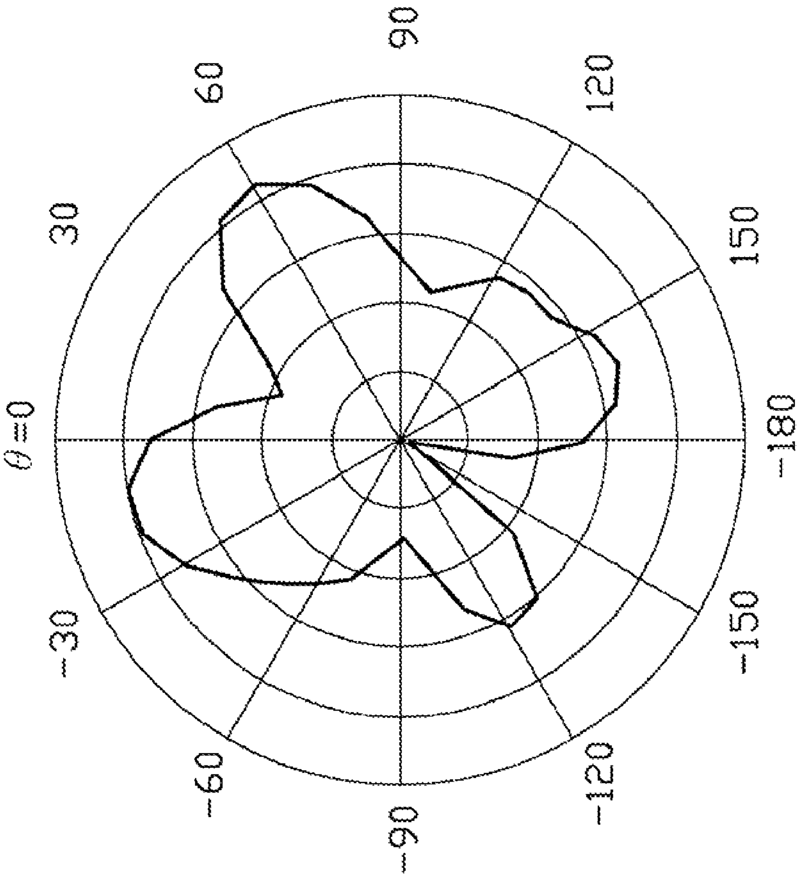
FIG. 7 is a diagram of an X-Y plane radiation field of the portable electronic device shown in FIG. 1.

Also referring to FIG. 4, when the antenna 80 is used to receive/send wireless signals in frequencies of about 2.43-2.48 GHz, the return loss of the antenna 80 is less than −6 dB. Therefore, the antenna 80 is suitable to be used in BLUETOOTH applications, which use wireless signals in frequencies of approximately 2.45 GHz. Also referring to FIGS. 5-7, the radiation field patterns of the antenna 80 in the X-Z plane, the Y-Z plane, and the X-Y plane are all acceptable.

In the present disclosure, the antenna 80 is integrated with the SD card retaining mechanism 50 and the battery 30, without occupying any additional space. Therefore, space for a conventional antenna (e.g., as a BLUETOOTH antenna identified above) in the portable electronic device 100 is saved, which allows for further miniaturization of the portable electronic device 100 and can result in lower costs.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A portable electronic device, comprising:

a housing;

a circuit board received in the housing; and a memory card retaining mechanism received in the housing; wherein the memory card retaining mechanism including a plurality of conductive parts, and the plurality of conductive parts cooperatively form an antenna integrated with the memory card retaining mechanism and connected to the circuit board;

wherein the memory card retaining mechanism includes a bottom board, a top board, a first sidewall, a second sidewall, and an end wall; the first sidewall, the second sidewall, and the end wall positioned between the bottom board and the top board, and respectively connected to the bottom board and the top board; the first sidewall and the second sidewall connected to a same side of the end wall;

wherein the conductive parts include the to board, the first sidewall, and the end wall; and the second sidewall is insulating;

wherein the memory card retaining mechanism includes a first connector member and a second connector member; the first connector member and the second connector member being both conductive; the first connector member and the second connector member both mounted on the second sidewall and separated from each other, the first connector member connected to the top board, the end wall, and the circuit board, the second connector member connected to the top board and the circuit board;

wherein the to board, the first sidewall, the end wall, the first connector member, and the second connector member cooperatively form the antenna integrated with the memory card retaining mechanism;

wherein a plurality of holes and slots are defined in the top board to regulate the impedance of the antenna.

2. The portable electronic device as claimed in claim 1, wherein the bottom board is fixed on the circuit board.

3. The portable electronic device as claimed in claim 1, wherein the top wall, the first sidewall, and the end wall serve as a radio portion of the antenna.

4. The portable electronic device as claimed in claim 1, wherein the antenna is grounded through the first connector member.

5. The portable electronic device as claimed in claim 1, wherein feed signals are provided to the antenna through the second connector member.

6. The portable electronic device as claimed in claim 1, further comprising a battery received in the housing, the memory card retaining mechanism between the circuit board and the battery, and conductive parts of the battery are coupled with the antenna and resonate with the antenna when the antenna works.

* * * * *